United States Patent
Nakata

(10) Patent No.: US 6,970,381 B2
(45) Date of Patent: Nov. 29, 2005

(54) SEMICONDUCTOR MEMORY

(75) Inventor: Daisuke Nakata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 10/747,692

(22) Filed: Dec. 30, 2003

(65) Prior Publication Data

US 2004/0179401 A1  Sep. 16, 2004

(30) Foreign Application Priority Data

Feb. 27, 2003 (JP) ............................. 2003-050264

(51) Int. Cl.$^7$ ............................................. G11C 11/34

(52) U.S. Cl. .................... 365/185.04; 365/228
(58) Field of Search ............................ 365/228, 185.04

(56) References Cited

U.S. PATENT DOCUMENTS 6,031,757 A * 2/2000 Chuang et al. ........ 365/185.04
6,731,536 B1 * 5/2004 McClain et al. ....... 365/185.04

OTHER PUBLICATIONS

Patent Abstract of Japan, Publication No., 2001-051904, published Feb. 23, 2001.

* cited by examiner

Primary Examiner—Michael Tran
(74) Attorney, Agent, or Firm—Staas & Halsey LLP.

(57) ABSTRACT

A semiconductor memory in which the protection state of data in a nonvolatile memory can be changed quickly and which provides sufficient security. A volatile protection state specification section controls the protection state of data in the nonvolatile memory. A nonvolatile initial state store section determines the initial state of the protection state specification section.

11 Claims, 13 Drawing Sheets

SEMICONDUCTOR MEMORY

CROSS-REFERENCE TO RELATED APPLICATIONS

This application is based upon and claims the benefits of priority from Japanese Patent Application No. 2003-050264, filed on Feb. 27, 2003, the entire contents of which are incorporated herein by reference.

BACKGROUND OF THE INVENTION (1) Field of the Invention

This invention relates to a semiconductor memory and, more particularly, to a semiconductor memory having the function of protecting data stored in a nonvolatile semiconductor memory.

(2) Description of the Related Art

Some of semiconductor memories, such as flash memories, including an electrically rewritable and erasable nonvolatile memory have the function of protecting data stored in a nonvolatile semiconductor memory (nonvolatile memory), such as an electrically erasable programmable read only memory (EEPROM) (see, for example, Japanese Unexamined Patent Publication No. 2001-51904 (FIG. 3)) to prevent important data from being lost due to writing or erasing caused by false operation.

Conventional semiconductor memories having the function of protecting data can be divided broadly into the following two categories.

Conventional semiconductor memories which belong to one category include a 1-bit nonvolatile store section (which will be described later with a nonvolatile bit) for specifying the protection state of a nonvolatile memory.

FIG. 10 is a schematic view for describing data protection by the use of a nonvolatile bit.

In this example, data protection in a nonvolatile memory 100$a$ made up of four sectors (a sector is an erase unit) is shown.

As shown in FIG. 10, nonvolatile bits NBa0, NBa1, NBa2, and NBa3 for specifying the protection state of data in sectors 0, 1, 2, and 3, respectively, are included.

It is assumed that if a write state ("1") is specified by the nonvolatile bits NBa0 through NBa3, then data in the sectors corresponding to them is protected and that if an erase state ("0") is specified by the nonvolatile bits NBa0 through NBa3, then data in the sectors corresponding to them is not protected.

The nonvolatile bits NBa0 through NBa3 are written individually and are erased in block.

FIG. 11 is a flow chart showing the flow of a conventional process performed when data is written to a sector protected by a nonvolatile bit.

For example, to write data to the protected sector 0 in the nonvolatile memory 100$a$ shown in FIG. 10, first of all the protection of the sector 0 must be canceled. In this case, information in the nonvolatile bits NBa0 through NBa3 for specifying the protection state of the sectors 0 through 3, respectively, is first stored temporarily in a random access memory (RAM) (S10). Next, to prevent the nonvolatile bits NBa1, NBa2, and NBa3 which are not in a write state from being overerased, preprogramming is performed (S11). After that, the nonvolatile bits NBa0 through NBa3 are erased in block (S12). As a result, the protection of the sector 0 is canceled and data is written to the sector 0 (S13). Afterwards, the sector 0 is protected again. To be concrete, after writing is completed, the information in the nonvolatile bits NBa0 through NBa3 stored in the RAM is read (S14), the nonvolatile bit NBa0 corresponding to the sector 0 is written again to protect the sector 0 (S15), and the process terminates.

In the above process, a time-out of about (150[$\mu$s] ×number of bits) will occur in step S11. A time-out of about 1.5 ms will occur in step S12. There will be waiting time expressed in milliseconds after step S12 being completed and before the writing of data in step S13 being begun. Moreover, a time-out of about 150 $\mu$s will occur in step S15.

Therefore, in many cases, a nonvolatile bit for protecting data is used mainly for protecting a boot code the protection state of which is set only once before being implemented on a system substrate on the user side and which will not be rewritten.

Conventional semiconductor memories which belong to the other category include a 1-bit volatile protection state specification section (volatile bit) for determining the protection state of a sector.

FIG. 12 is a schematic view for describing data protection by the use of a volatile bit.

In this example, data protection in a nonvolatile memory 100$b$ made up of four sectors (a sector is an erase unit) is shown.

As shown in FIG. 12, volatile bits VBa0, VBa1, VBa2, and VBa3 for specifying the protection state of data in sectors 0, 1, 2, and 3, respectively, are included.

When a write state ("1") is specified by the volatile bits VBa0 through VBa3, then data in the sectors corresponding to them will be protected. If an erase state ("0") is specified by the volatile bits VBa0 through VBa3, then data in the sectors corresponding to them will not be protected.

The volatile bits VBa0 through VBa3 are written or erased individually. When power is turned off, information indicative of the protection state of a sector will be lost. If the volatile bits VBa0 through VBa3 are used, writing will not involve waiting time. This enables a frequent change in the protection state of a sector.

Furthermore, there are semiconductor memories in which the rewriting of the protection state of data described above is restricted by the use of a password.

FIG. 13 is a schematic view showing an outline of a conventional semiconductor memory in which the protection state of data is changed by the use of a password.

In this example, data protection in a nonvolatile memory 100$c$ made up of four sectors is shown. This is the same with FIGS. 10 and 12.

This semiconductor memory includes volatile bits VBb0, VBb1, VBb2, and VBb3 corresponding to sectors 0, 1, 2, and 3, respectively, and nonvolatile bits NBb0, NBb1, NBb2, and NBb3 corresponding to the sectors 0, 1, 2, and 3, respectively. The logical sum of VBb0 and NBb0 is found out by the use of an OR circuit 200 to determine the protection state of data in the sector 0. Similarly, the logical sum of VBb1 and NBb1 is found out by the use of an OR circuit 201 to determine the protection state of data in the sector 1. The logical sum of VBb2 and NBb2 is found out by the use of an OR circuit 202 to determine the protection state of data in the sector 2. The logical sum of VBb3 and NBb3 is found out by the use of an OR circuit 203 to determine the protection state of data in the sector 3.

In addition, the semiconductor memory includes a volatile bit VBSa for security which locks the state of the nonvolatile bits NBb0 through NBb3 and two nonvolatile bits NBSPa (for password mode) and NBSNa (for non-password mode) for security which determine the initial state of the volatile bit VBSa. When the nonvolatile bit NBSPa indicates a write state, password mode is set and the volatile bit VBSa for security indicates a write state. A password must be inputted to erase it. On the other hand, when the nonvolatile bit NBSNa indicates a write state, the initial state of the volatile bit VBSa at the time of power being applied is an erase state ("0"). Therefore, writing or erasing can be performed without a password being inputted.

However, if nonvolatile bits are used for protecting data, in essence, erasing will take much time and a certain number of bits will be erased in block because of limitations of die size. Therefore, this method is not appropriate to cases where a protection function must be rewritten frequently.

If volatile bits are used for protecting data, a protection state can be changed in real time. However, when power is turned off, they will return to the initial state. Therefore, data protection is insufficient and there is a danger that data in a nonvolatile memory will be rewritten wrongfully by a third party.

With the conventional semiconductor memories in which bits for security are used, sufficient security is provided because the state of nonvolatile bits for protecting data is locked. However, it is difficult to frequently change a protection state on a system.

SUMMARY OF THE INVENTION

The present invention was made under the background circumstances as described above. An object of the present invention is to provide a semiconductor memory in which the protection state of data in a nonvolatile memory can be changed quickly and in which sufficient security is provided.

In order to achieve the above object, a semiconductor memory having the function of protecting data stored in a nonvolatile semiconductor memory is provided. This semiconductor memory comprises a volatile protection state specification section for controlling the protection state of data in the nonvolatile semiconductor memory and a nonvolatile initial state store section for controlling the initial state of the protection state specification section.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

Figure 1:
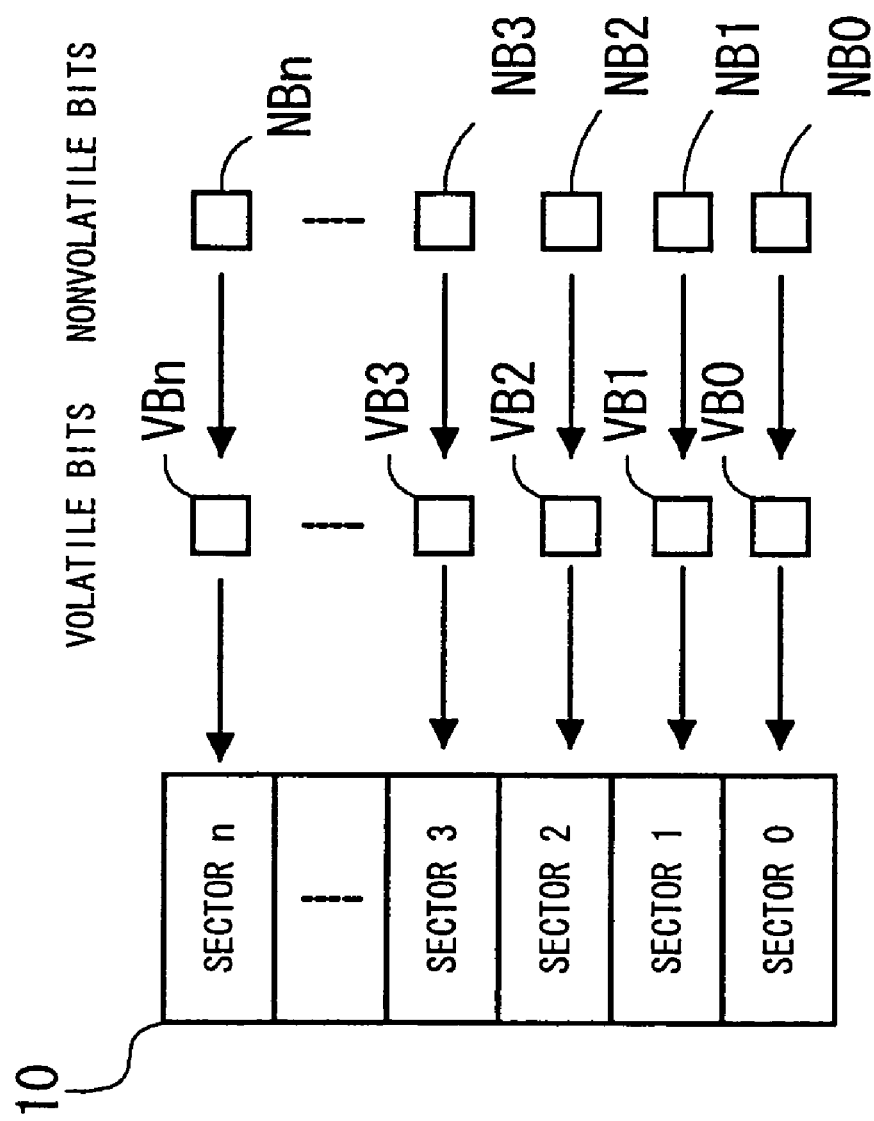
FIG. 1 is a schematic view for describing the principles underlying a semiconductor memory according to an embodiment of the present invention.

FIG. 1 is a schematic view for describing the principles underlying a semiconductor memory according to an embodiment of the present invention.

A semiconductor memory according to an embodiment of the present invention includes 1-bit volatile protection state specification sections (volatile bits) VB0, VB1, VB2, VB3, . . . , VBn for controlling the protection state of data in a nonvolatile memory 10 and nonvolatile initial state store sections (nonvolatile bits) NB0, NB1, NB2, NB3, . . . , and NBn for controlling the initial state of the protection state specification sections VB0, VB1, VB2, VB3, . . . , VBn.

As shown in FIG. 1, the volatile bits VB0 through VBn corresponding to sectors (a sector is an erase unit) 0, 1, 2, 3, . . . , n, respectively, in the nonvolatile memory 10 are included and are used for specifying the protection state of data in the sectors 0 through n respectively. Moreover, in this embodiment the nonvolatile bits NB0 through NBn for determining the initial state of the volatile bits VB0 through VBn, respectively, are included. It is a matter of course that the number of the nonvolatile bits is the same as that of the volatile bits.

In the initial state (such as when power is applied or when hardware is reset), the state of the nonvolatile bits NB0 through NBn is written to the volatile bits VB0 through VBn respectively. As a result, the protection state of data in the nonvolatile memory 10 will be determined. That is to say, when the volatile bits VB0 through VBn indicate a write state ("1"), data in the sectors 0 through n, respectively, will be protected. When the volatile bits VB0 through VBn indicate an erase state ("0"), data in the sectors 0 through n, respectively, will not be protected.

Figure 2:
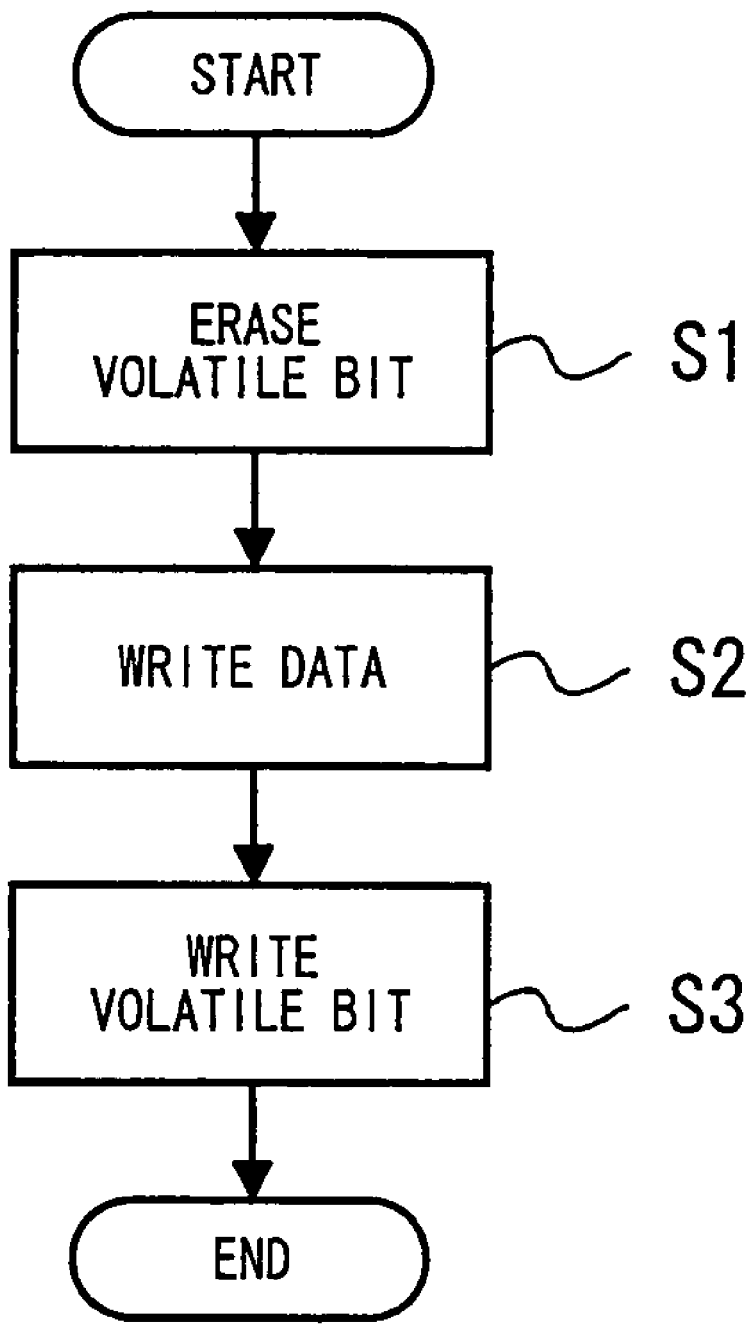
FIG. 2 is a flow chart showing the flow of a process performed when data is written to a protected sector.

FIG. 2 is a flow chart showing the flow of a process performed when data is written to a protected sector.

It is assumed that data is written to the protected sector 0 in the nonvolatile memory 10 shown in FIG. 1. To cancel the protection of the sector 0, the volatile bit VB0 is changed from a write state to an erase state (S1). Then data is written to the sector 0 which has become writable (S2). Finally, the volatile bit VB0 is changed to a write state to protect the sector 0 again (S3).

As stated above, the volatile bits VB0 through VBn are used for changing the protection state of the sectors 0 through n respectively. As a result, changing a protection state will not involve waiting time. Therefore, frequent requests to change a protection state can be complied with quickly. In addition, the nonvolatile bits NB0 through NBn corresponding to the volatile bits VB0 through VBn, respectively, are included. Accordingly, the state of the volatile bits VB0 through VBn can be set flexibly. Even when power is turned on or off, the protection state of each area can be held. As a result, sufficient security can be ensured.

Now, a case where a password is used for restricting the rewriting of the protection state of data will be described.

Figure 3:
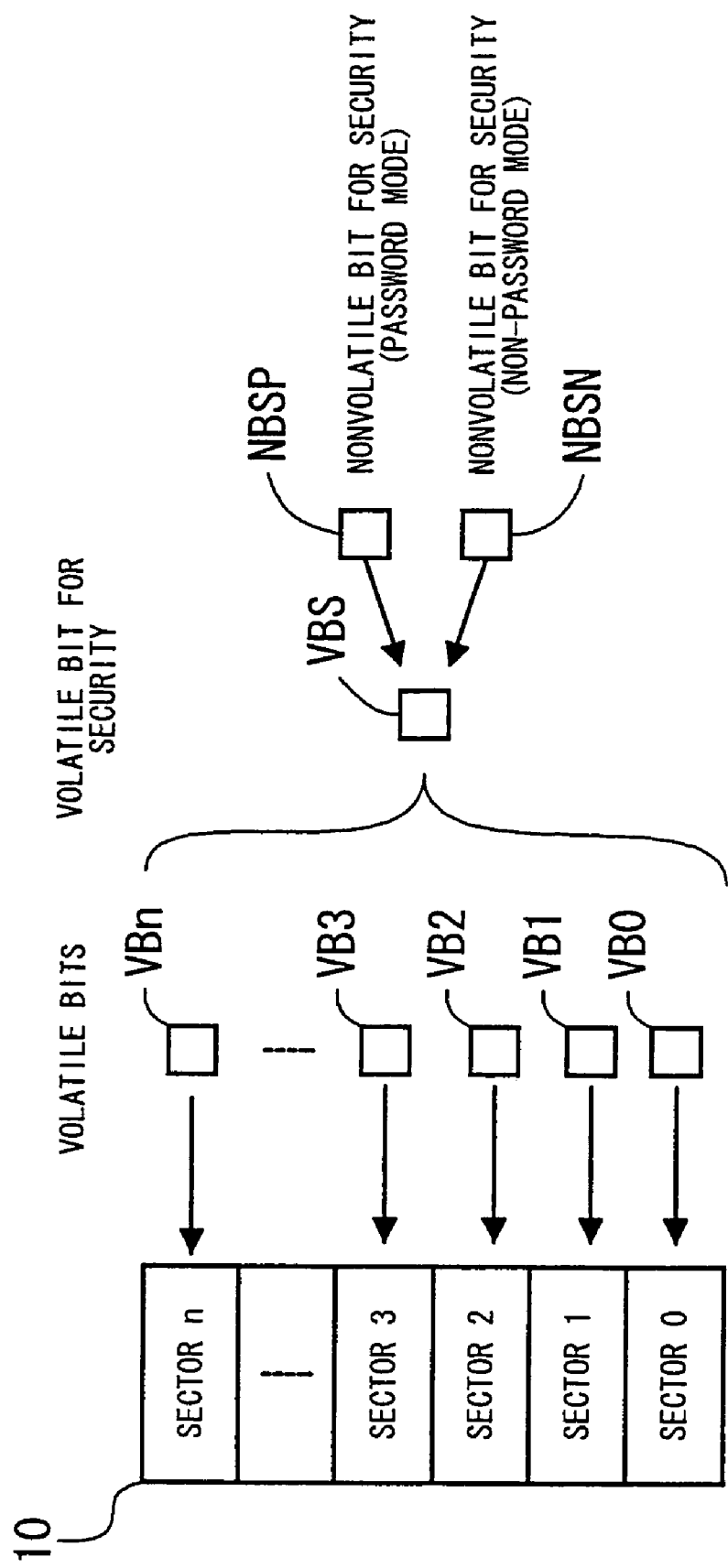
FIG. 3 is a schematic view showing an outline of a semiconductor memory according to an embodiment of the present invention in which bits for security are used.

FIG. 3 is a schematic view showing an outline of a semiconductor memory according to an embodiment of the present invention in which bits for security are used.

A semiconductor memory according to this embodiment of the present invention includes a volatile bit VBS for security which sets whether to lock the state of the volatile bits VB0 through VBn for specifying the protection state of the above sectors 0 through n, respectively. The semiconductor memory also includes nonvolatile bits NBSP and NBSN for security which specify the initial state of the volatile bit VBS. The nonvolatile bit NBSP is used for selecting password mode and the nonvolatile bit NBSN is used for selecting non-password mode. If one of the nonvolatile bits NBSP and NBSN specifies a write state, then the other will specify an erase state and writing cannot be performed.

The nonvolatile bits NB0 through NBn for specifying the initial state of the volatile bits VB0 through VBn, respectively, are shown in FIG. 1, but they are omitted in FIG. 3.

In the initial state at the time of, for example, power being applied, the state of the volatile bit VBS for security is determined by the state of the nonvolatile bits NBSP and NBSN. For example, when both of the nonvolatile bits NBSP and NBSN specify an erase state, the volatile bit VBS also specifies an erase state and therefore a non-locked state. As a result, the volatile bits VB0 through VBn for specifying the protection state of the nonvolatile memory 10 will go into a writable and erasable state.

When the nonvolatile bit NBSP specifies a write state, the initial state of the volatile bit VBS is also a write state and password mode is selected. At this time the state of the volatile bits VB0 through VBn for specifying the protection state of the nonvolatile memory 10 is locked and writing or erasing cannot be performed. Only if a correct password is inputted, the volatile bit VBS for security is erased and the volatile bits VB0 through VBn can be written or erased. By changing the volatile bit VBS to a write state, password mode can be selected again.

When the nonvolatile bit NBSN specifies a write state, the initial state of the volatile bit VBS is an erase state and non-password mode is selected. At this time the volatile bits VB0 through VBn for specifying the protection state of the nonvolatile memory 10 can be written or erased. The volatile bit VBS can be written or erased. By changing the volatile bit VBS to a write state, the state of the volatile bits VB0 through VBn can be locked.

As stated above, when password mode is selected, the protection state of the nonvolatile memory 10 is locked. To unlock the protection state of the nonvolatile memory 10, the volatile bit VBS for security must be erased. At this time authentication must be performed by the use of a password. This prevents data from being rewritten wrongfully by a third party.

The details of an embodiment of the present invention will now be described.

The details of a semiconductor memory according to an embodiment of the present invention will be described below with a flash memory as an example.

Figure 4:
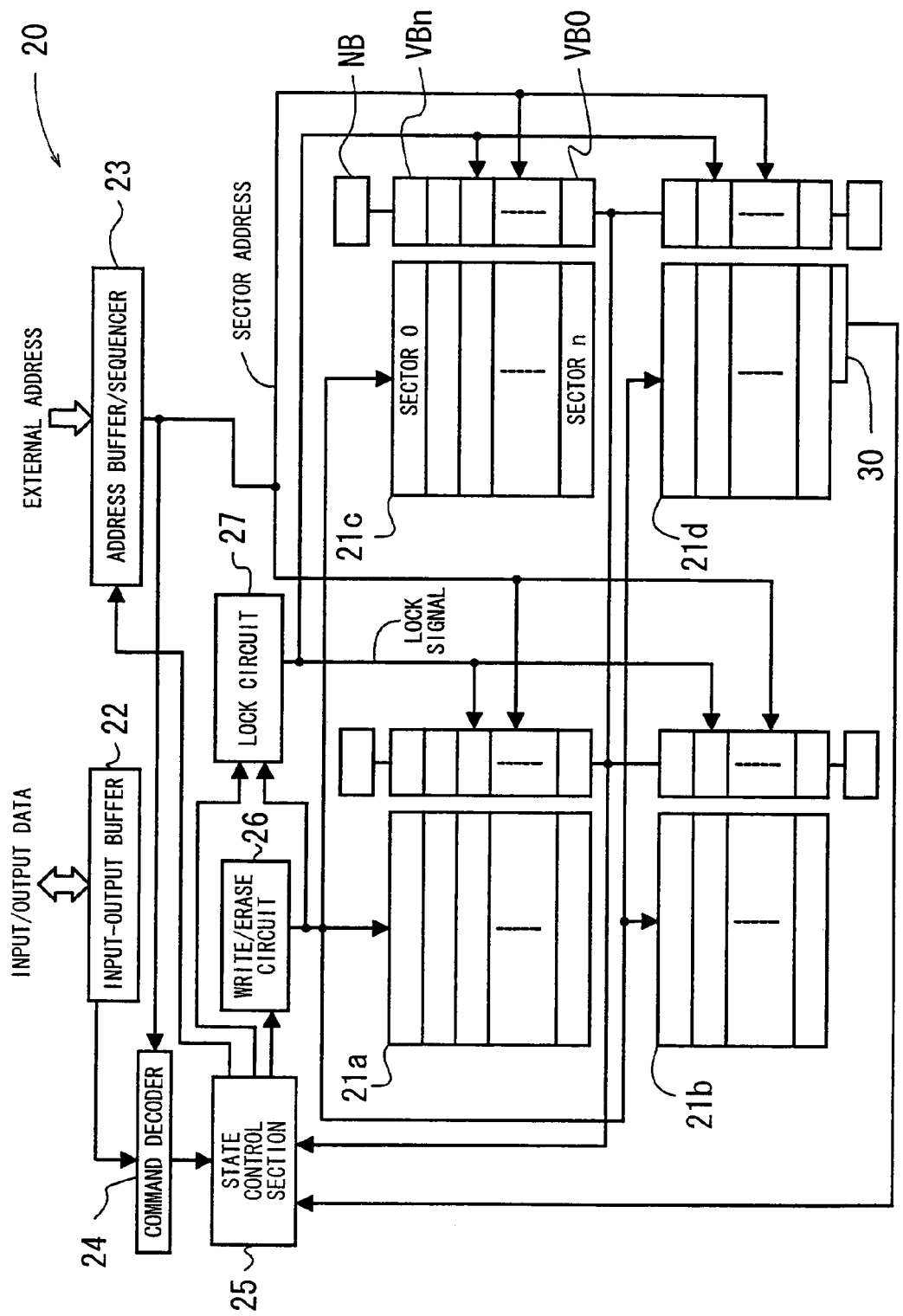
FIG. 4 is a view showing part of the structure of a flash memory.

FIG. 4 is a view showing part of the structure of a flash memory.

In this example, a nonvolatile memory is made up of four banks 21a, 21b, 21c, and 21d.

Each of the banks 21a, 21b, 21c, and 21d is made up of a plurality of sectors.

The bank 21c will now be described. The following description will also apply to the banks 21a, 21b, and 21d.

The bank 21c is made up of a plurality of sectors 0 through n similar to those shown in FIG. 1. A flash memory 20 also includes volatile bits VB0 through VBn for specifying the protection state of data in the sectors 0 through n respectively. In addition, the flash memory 20 includes a nonvolatile bit NB for specifying the initial state of the volatile bits VB0 through VBn. In FIG. 1, the nonvolatile bits NB0 through NBn corresponding to the volatile bits VB0 through VBn, respectively, are included. In FIG. 4, however, one nonvolatile bit NB is included for one bank. As a result, the initial state of the protection of data in one bank can be determined uniquely by the state of the nonvolatile bit NB. Moreover, this will save space.

Furthermore, the flash memory 20 includes an input-output buffer 22 for inputting data from or outputting data to the outside, an address buffer/sequencer 23 for inputting an external address and for supplying it to the inside, a command decoder 24 for generating a command from a control signal supplied from the outside and command-related data, a state control section 25 for controlling writing, erase operation, and the like on the basis of a generated command, an address signal, and the like, a write/erase circuit 26 for generating voltage necessary for writing or erase operation, a lock circuit 27 for specifying the protection state of data according to security levels, and a password store section 30 for storing a password for unlocking the protection state of data.

The lock circuit 27 includes the volatile bit VBS for security and the nonvolatile bits NBSP and NBSN for security shown in FIG. 3. The details of the lock circuit 27 will be described later.

The operation of protecting data performed in the flash memory 20 in the case of the protection state of data specified by the lock circuit 27 not being locked, that is to say, in the case of a lock signal being at the H (high) level will be described first.

The protection of data in the bank 21c will now be described. The following description applies to the banks 21a, 21b, and 21d.

In the bank 21c, the initial state of the volatile bits VB0 through VBn at the time of, for example, power being applied is determined by the state of the nonvolatile bit NB. That is to say, when the nonvolatile bit NB is in a write state ("1"), the volatile bits VB0 through VBn are also in a write state. This information is transmitted to the state control section 25 and a command to write or erase the bank 21c is ignored. As a result, all of the sectors 0 through n which make up the bank 21c are protected. On the other hand, when the nonvolatile bit NB is in an erase state ("0"), the initial state of the volatile bits VB0 through VBn is also an erase state. In this case, all of the sectors 0 through n which make up the bank 21c are non-protected and writing or erasing can be performed.

The volatile bits VB0 through VBn can be rewritten in accordance with an instruction from the outside. In this case, the protection state of data in each of the sectors 0 through n can be changed by rewriting the state of the volatile bits VB0 through VBn corresponding to sector addresses generated by the address buffer/sequencer 23. When power is applied again, they will return to the initial state.

When the protection state of data specified by the lock circuit 27 is locked, that is to say, when a lock signal is at the low (L) level, the state of the volatile bits VB0 through VBn will be locked. This makes it impossible to rewrite the state of the volatile bits VB0 through VBn. To unlock, the state control section 25 must perform authentication by comparing a password inputted from the outside and, for example, a 64-bit password stored in the password store section 30. If they match, then the state control section 25 informs the lock circuit 27 to that effect to make it unlock protection states specified by the volatile bits VB0 through VBn (change lock signals to the H level).

The details of the nonvolatile bit NB will now be described.

Figure 5:
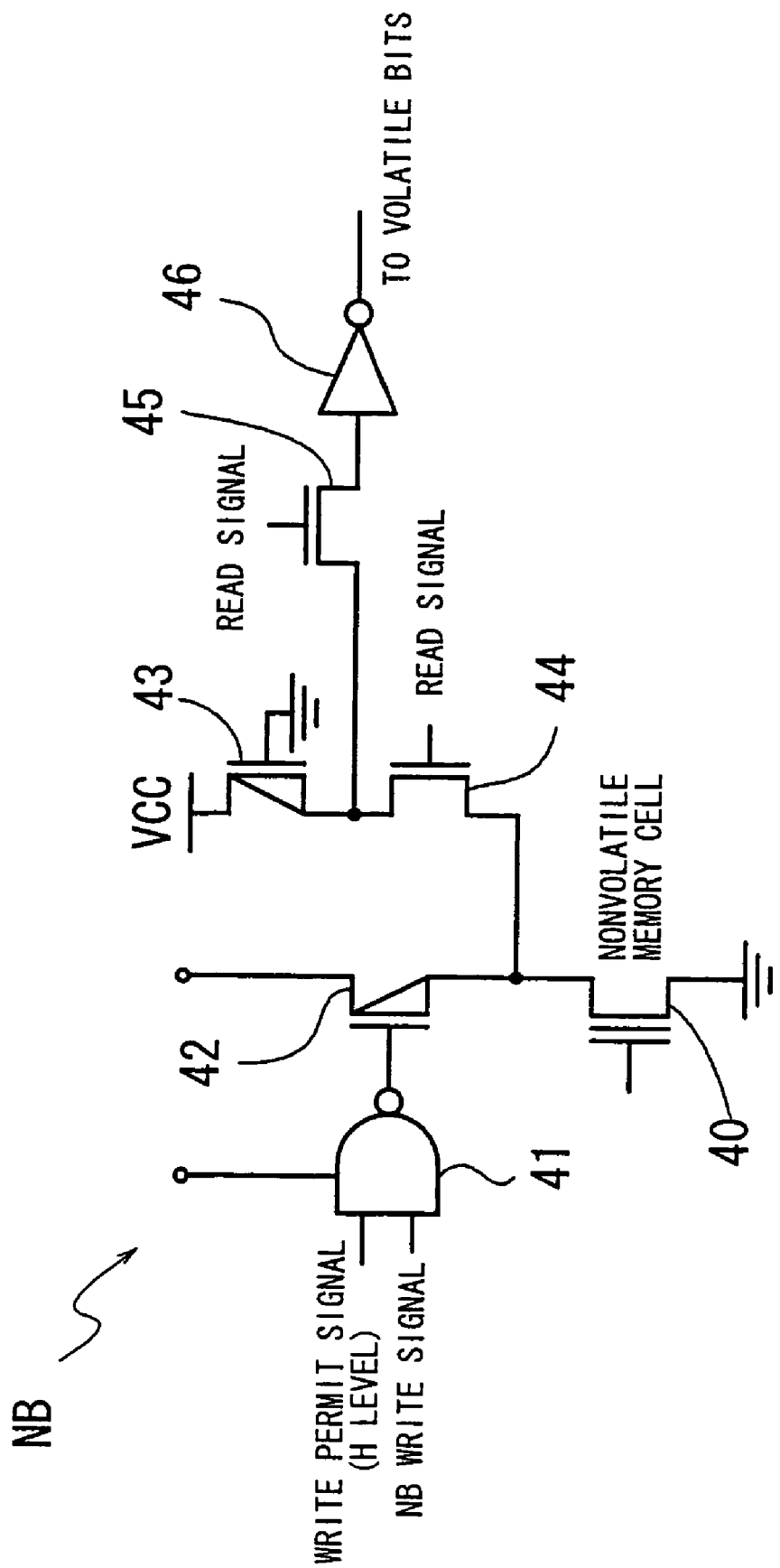
FIG. 5 is a circuit diagram of a nonvolatile bit NB.

FIG. 5 is a circuit diagram of the nonvolatile bit NB.

The nonvolatile bit NB includes a nonvolatile memory cell 40, a NAND circuit 41 where a write permit signal for permitting writing (which is always at the H level) and an NB write signal inputted at the time of the nonvolatile bit NB being written are inputted, p-channel metal oxide semiconductor (MOS) transistors (pMOSes) 42 and 43, n-channel MOS transistors (nMOSes) 44 and 45, and an inverter 46.

Output from the NAND circuit 41 is inputted to a gate of the pMOS 42. One input-output terminal (drain or source) of the pMOS 42 is connected to the write/erase circuit 26 (not shown) for supplying high voltage at programming time and the other input-output terminal of the pMOS 42 is connected to one input-output terminal of the nonvolatile memory cell 40 and one input-output terminal of the nMOS 44. The other input-output terminal of the nonvolatile memory cell 40 is grounded. When a read signal is inputted to a gate of the nMOS 44, the state of the nonvolatile memory cell 40 is sent to the other input-output terminal of the nMOS 44 and is outputted to the volatile bits VB0 through VBn via the nMOS 45 which turns on at the time of a read signal being inputted to its gate and the inverter 46. These read signals are inputted in the initial state, such as when power is applied.

When the nonvolatile memory cell 40 is in an erase state ("0"), the nonvolatile memory cell 40 is in the ON state and therefore at the L level. When read signals are inputted, this signal at the L level is sent to the inverter 46 via the nMOSes 44 and 45, is inverted by the inverter 46 to the H level, and is outputted.

On the other hand, when the nonvolatile memory cell 40 is in a write state ("1"), the nonvolatile memory cell 40 is in the OFF state. When a read signal is inputted to the gate of the nMOS 45, power supply VCC connected to one input-output terminal of the pMOS 43 the other input-output terminal of which is connected to the point where the nMOSes 44 and 45 connect is inverted by the inverter 46 to the L level and is outputted.

Writing to the nonvolatile bit NB can be performed when an NB write signal changes to the H level due to command input from the outside. At this time output from the NAND circuit 41 changes to the L level, the pMOS 42 turns on, and high voltage is applied to the nonvolatile memory cell 40. As a result, electrons are injected into the nonvolatile memory cell 40 and it goes into a write state.

At the time of a shipment from a factory the nonvolatile bit NB is in an erase state. By writing to the nonvolatile bit NB for each bank, a user can select the optimal initial state of the volatile bits VB0 through VBn according to systems.

Security can be enhanced by setting the nonvolatile bit NB so that it can be written only once and by prohibiting erasing the nonvolatile bit NB written once.

Figure 6:
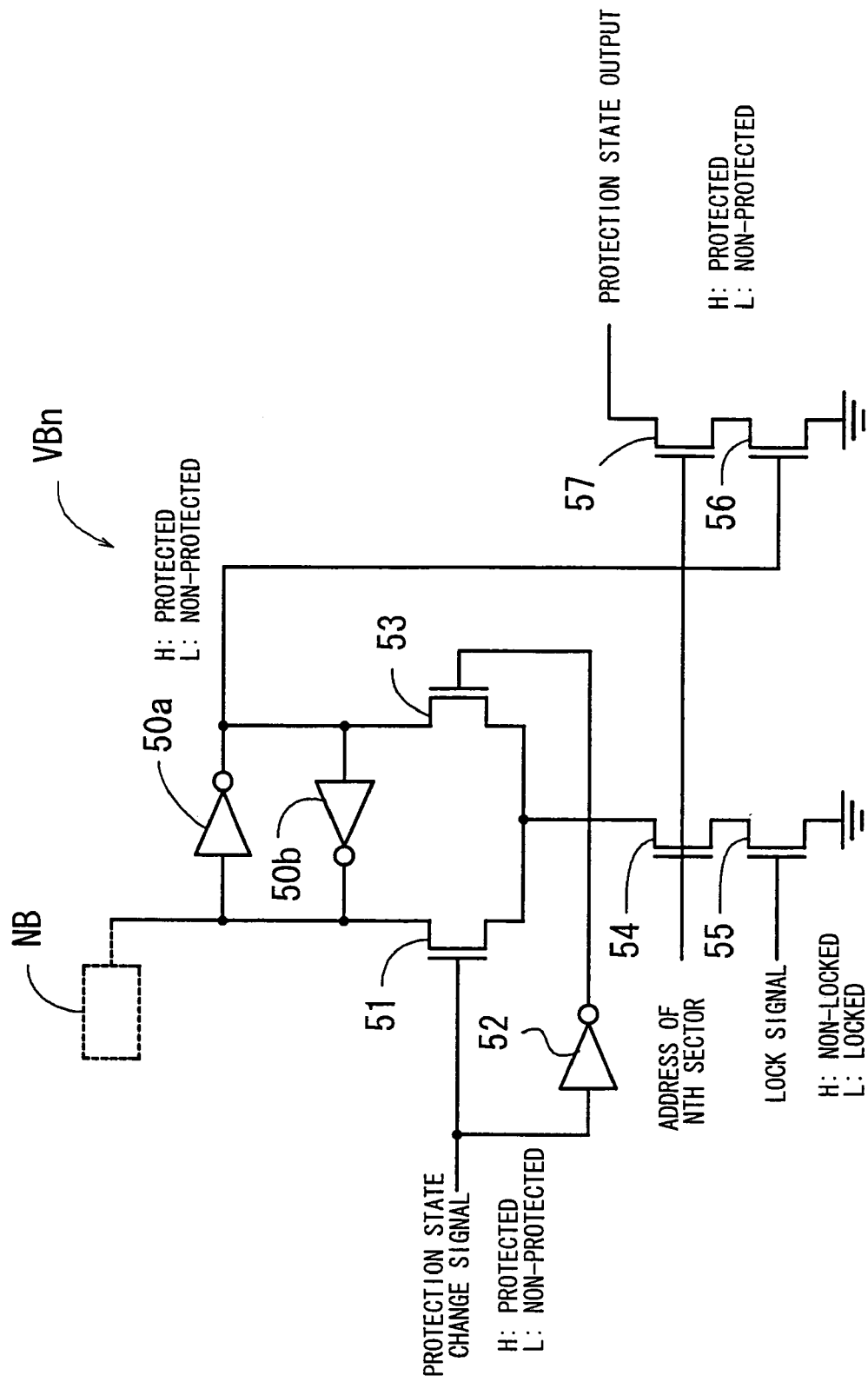
FIG. 6 is a circuit diagram of a volatile bit VB for data protection which protects an nth sector.

FIG. 6 is a circuit diagram of a volatile bit VB for data protection which protects an nth sector.

The volatile bit VBn includes inverters 50*a* and 50*b* which make up a latch circuit for inputting and holding output from the nonvolatile bit NB, an nMOS 51 one input-output terminal of which is connected to the input side of the latch circuit and to a gate of which a protection state change signal for changing the protection state of the sector n is inputted, an inverter 52 one input-output terminal of which is connected to the output side of the latch circuit and which inverts a protection state change signal, and an nMOS 53 to a gate of which an inverted protection state change signal is inputted. Moreover, the other input-output terminal of the nMOS 51 and one input-output terminal of the nMOS 53 are connected directly and these terminals are connected to one input-output terminal of an nMOS 54 which turns on at the time of the address of the nth sector being inputted. The other input-output terminal of the nMOS 54 is connected to one input-output terminal of an nMOS 55 which is in the ON state at the time of a lock signal from the lock circuit 27 being at the H level (non-locked state). The other input-output terminal of the nMOS 55 is grounded.

Output from the latch circuit is taken out from the inverter 50*a* and is inputted to a gate of an nMOS 56. When output from the latch circuit is at the H level, the nth sector is protected. When output from the latch circuit is at the L level, the nth sector is not protected. One input-output terminal of the nMOS 56 is connected one input-output terminal of an nMOS 57 which turns on at the time of the address of the nth sector changing to the H level. The state of the nth volatile bit VBn is outputted from the other input-output terminal of the nMOS 57. When output from this terminal is at the L level, the nth sector is protected. When output from this terminal is at the H level, the nth sector is not protected.

Operation will now be described.

In the initial state at the time of, for example, power being applied, the nonvolatile bit NB is read and the initial state of the volatile bit VBn is set.

When the nth sector n is selected (the address of the nth sector is at the H level) at the time of the sector n being written or erased and output from the latch circuit is at the H level, output from the volatile bit VBn changes to the L level. The state control section 25 detects this signal and ignores a command to write or erase the sector n. On the other hand, when output from the latch circuit is at the L level, output from the volatile bit VBn changes to the H level. The state control section 25 detects this signal. If there is a command to write or erase the sector n, the state control section 25 informs the write/erase circuit 26 about it to perform writing or erasing.

When a lock signal is at the H level (non-locked state), the protection state of the sector n can be changed. To change the protection state of the sector n from a protected state to a non-protected state, output from the latch circuit should be changed to the L level by changing a protection state change signal to the L level.

To change the protection state of the sector n from a non-protected state to a protected state, output from the latch circuit should be changed to the H level by changing a protection state change signal to the H level.

When a lock signal is at the L level, a protection state change signal is invalid and the protection state of the sector n cannot be changed.

As stated above, if a volatile bit for changing the protection state of data in a sector and a nonvolatile bit for determining the initial state of the volatile bit are combined, a change in the protection state of data does not involve waiting time. Moreover, even when power is turned on or off, the protection state of data in each area (in each bank, in the above example) can be held. Therefore, sufficient security can be ensured.

The details of the lock circuit 27 will now be described.

The lock circuit 27 includes the volatile bit VBS for security and the nonvolatile bits NBSP and NBSN for security shown in FIG. 3. The nonvolatile bits NBSP and NBSN will be described first.

Figure 7:
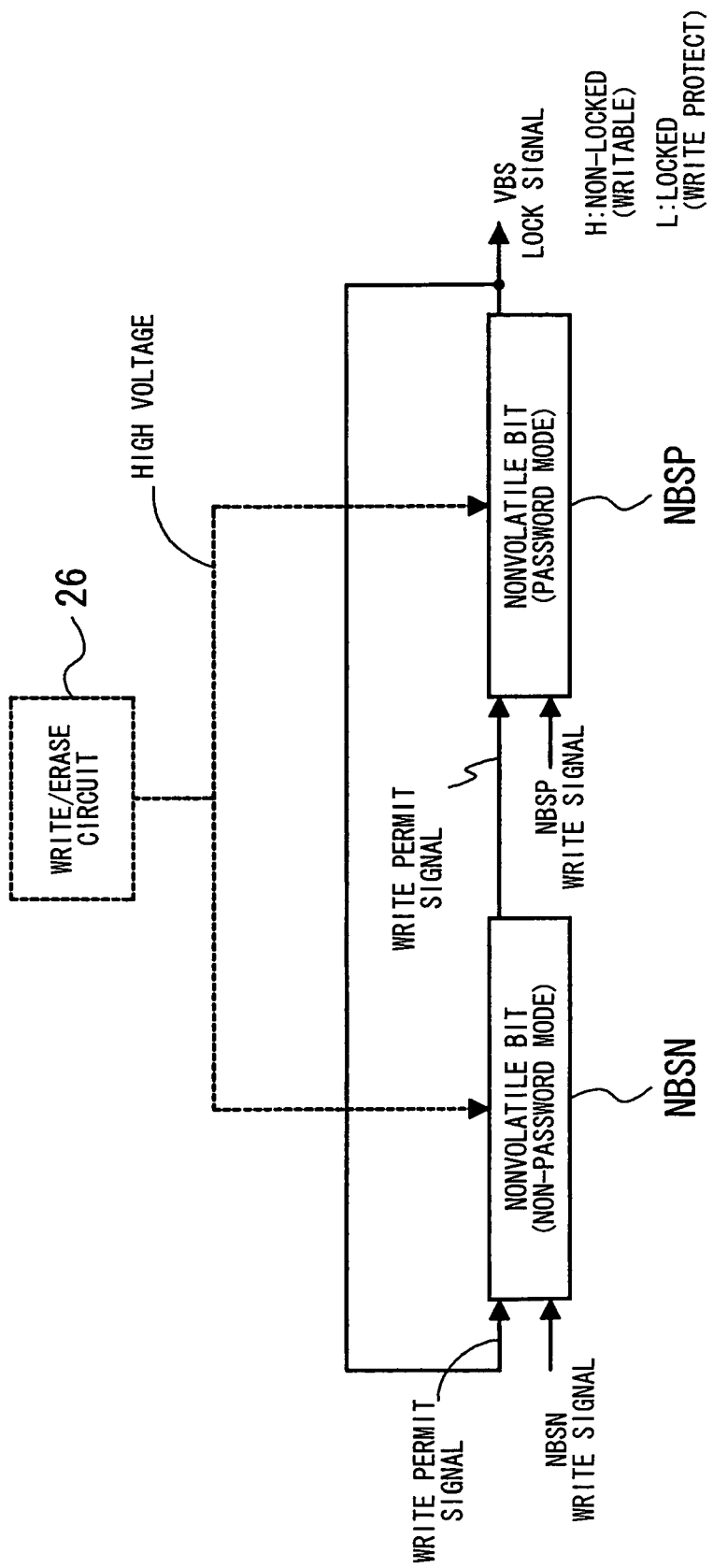
FIG. 7 is a view showing the structure of nonvolatile bits NBSP and NBSN for security.

FIG. 7 is a view showing the structure of the nonvolatile bits NBSP and NBSN for security.

The nonvolatile bit NBSN for non-password mode and the nonvolatile bit NBSP for password mode are included as nonvolatile bits for security. A write permit signal outputted from the nonvolatile bit NBSN for non-password mode is inputted to the nonvolatile bit NBSP for password mode. Output from the nonvolatile bit NBSP is not only inputted to the volatile bit VBS for security as a lock signal but also inputted again to the nonvolatile bit NBSN as a write permit signal. In addition, the nonvolatile bits NBSP and NBSN are connected to the above write/erase circuit 26 and are supplied with high voltage at write time. Moreover, an NBSN write signal which changes to the H level at the time of the nonvolatile bit NBSN being written and an NBSP write signal which changes to the H level at the time of the nonvolatile bit NBSP being written are inputted to the nonvolatile bits NBSN and NBSP respectively.

At the time of shipment both the nonvolatile bits NBSN and NBSP are in an erase state. The following description therefore will be given on the assumption that a write permit signal is at the H level.

Now, the circuit structure of the nonvolatile bit NBSN will be described. The circuit structure of the nonvolatile bit NBSP is the same as that of the nonvolatile bit NBSN.

Figure 8:
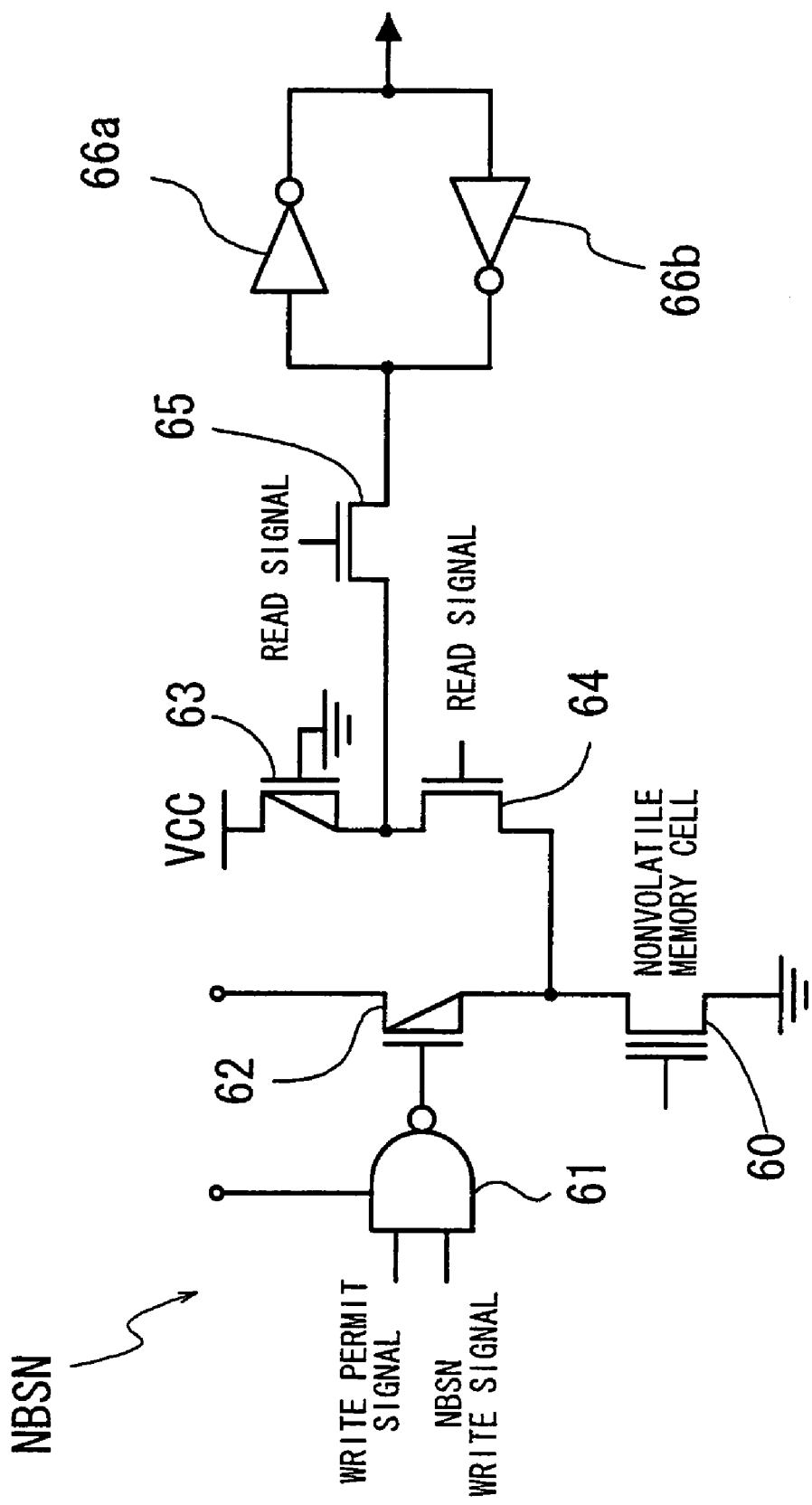
FIG. 8 is a circuit diagram showing an example of the circuit structure of the nonvolatile bit NBSN.

FIG. 8 is a circuit diagram showing an example of the circuit structure of the nonvolatile bit NBSN.

The nonvolatile bit NBSN includes a nonvolatile memory cell 60, a NAND circuit 61 where a write permit signal and an NBSN write signal (in the case of the nonvolatile bit NBSP for password mode, an NBSP write signal) are inputted, pMOSes 62 and 63, nMOSes 64 and 65, and inverters 66a and 66b which make up a latch circuit.

Output from the NAND circuit 61 is inputted to a gate of the PMOS 62. One input-output terminal of the pMOS 62 is connected to the above write/erase circuit 26 for supplying high voltage at write time and the other input-output terminal of the pMOS 62 is connected to one input-output terminal of the nonvolatile memory cell 60 and one input-output terminal of the nMOS 64. The other input-output terminal of the nonvolatile memory cell 60 is grounded. When a read signal is inputted to a gate of the nMOS 64, the state of the nonvolatile memory cell 60 is sent to the other input-output terminal of the nMOS 64 and is outputted via the nMOS 65 which turns on at the time of a read signal being inputted to its gate and the latch circuit as a write permit signal (and a VBS lock signal in the case of the nonvolatile bit NBSP). These read signals are inputted in the initial state, such as when power is applied.

As stated above, the circuit structure of the nonvolatile bits NBSN and NBSP is almost the same as that of the nonvolatile bit NB shown in FIG. 5. The operation of the nonvolatile bits NBSN and NBSP, too, is almost the same as that of the nonvolatile bit NB. Therefore, a detailed description of the operation of the nonvolatile bits NBSN and NBSP will be omitted. The operation of the nonvolatile bits NBSN and NBSP included in the lock circuit 27 will now be described roughly by the use of FIGS. 7 and 8.

At the time of shipment both the nonvolatile bits NBSN and NBSP are in an erase state. Therefore, a VBS lock signal outputted is at the H level and the protection state of data is not locked.

To set non-password mode, an NBSN write signal inputted to the nonvolatile bit NBSN is changed to the H level by a command from the outside. This puts the nonvolatile bit NBSN into a write state. As a result, output from the nonvolatile bit NBSN changes to the L level and a VBS clock signal outputted from the nonvolatile bit NBSP changes to the H level (that is to say, a non-locked state).

On the other hand, to set password mode, an NBSP write signal inputted to the nonvolatile bit NBSP is changed to the H level by a command from the outside. This puts the nonvolatile bit NBSP into a write state. As a result, a VBS lock signal outputted from the nonvolatile bit NBSP changes to the L level (that is to say, a locked state). At this time a write permit signal inputted to the nonvolatile bit NBSN changes to the L level, so writing to the nonvolatile bit NBSN is prohibited.

As described above, when one of the nonvolatile bits NBSN and NBSP is in a write state, the other is in an erase state.

Security can be enhanced by setting the nonvolatile bits NBSN and NBSP so that they can be written only once and by prohibiting erasing the nonvolatile bits NBSN and NBSP written once.

A VBS lock signal outputted from the nonvolatile bit NBSP is inputted to the volatile bit VBS for security.

Figure 9:
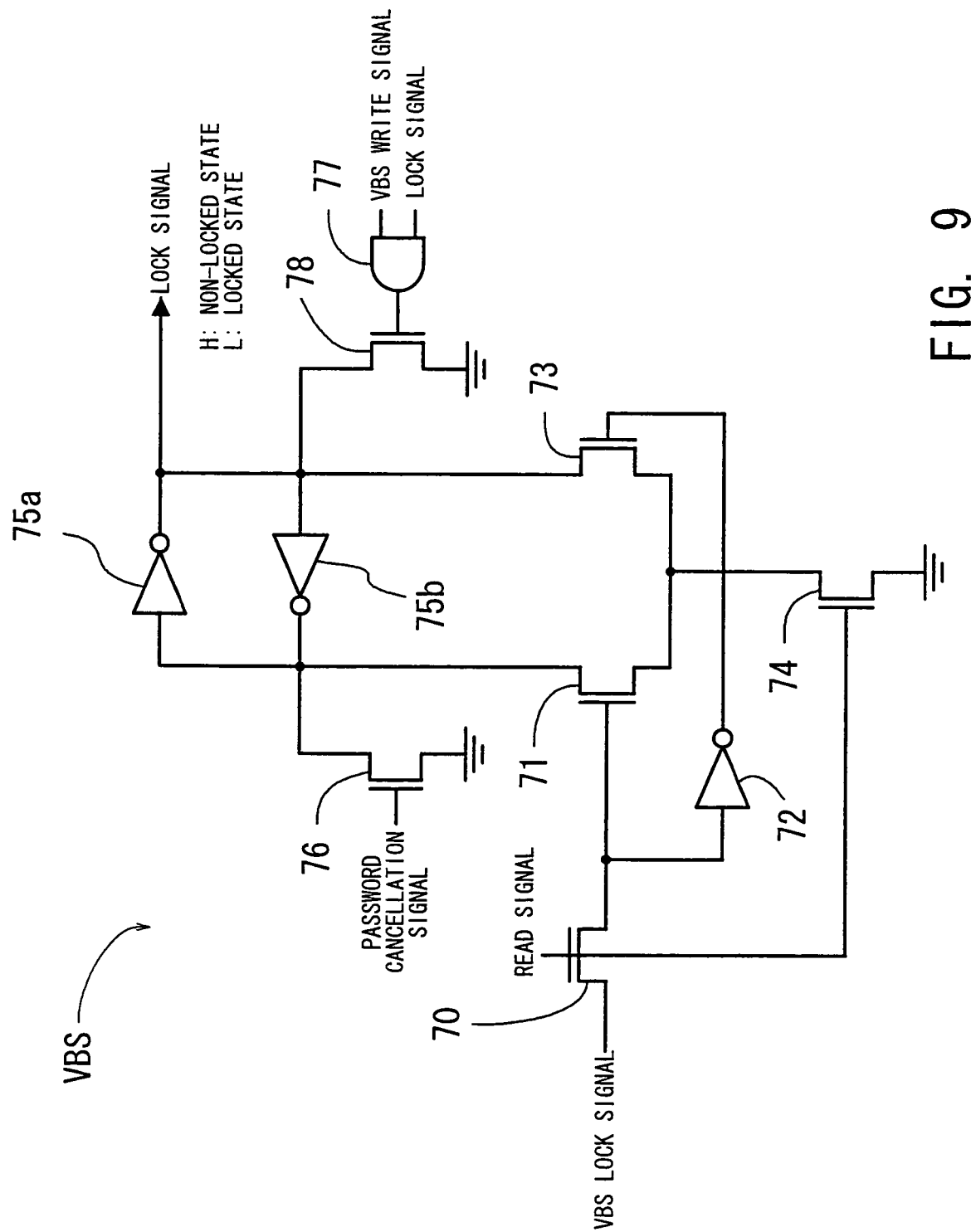
FIG. 9 is a view showing an example of the circuit structure of a volatile bit VBS for security.
Figure 10:
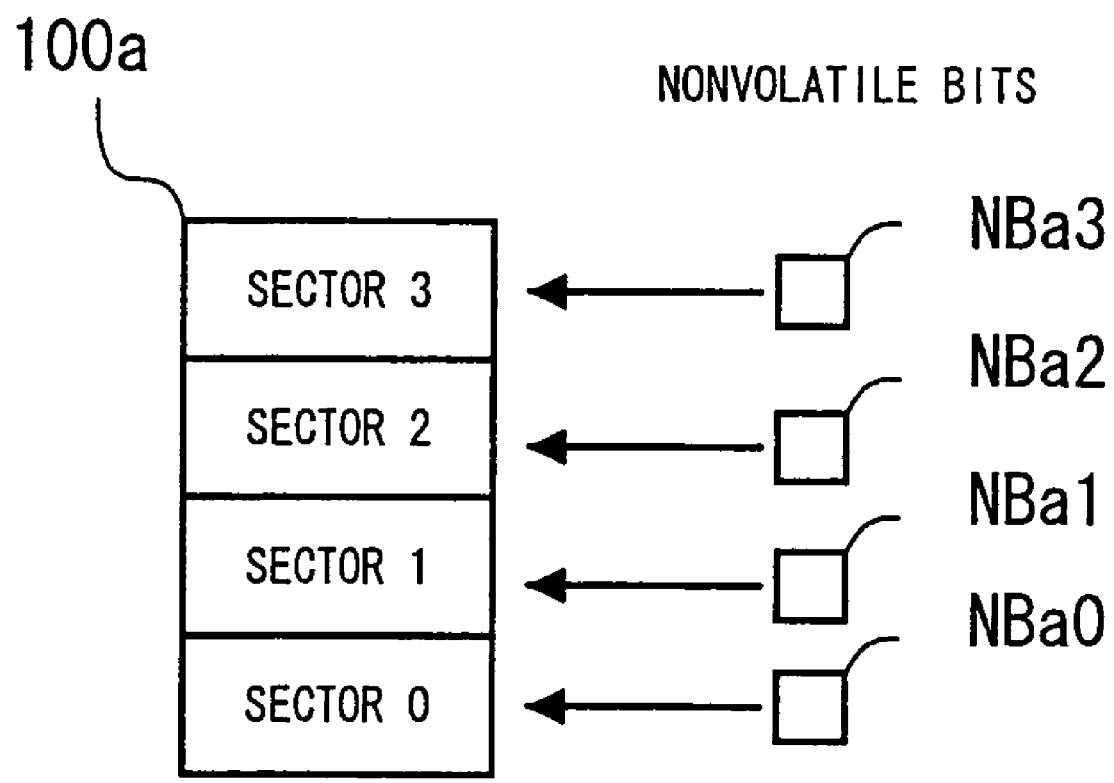
FIG. 10 is a schematic view for describing data protection by the use of a nonvolatile bit.
Figure 11:
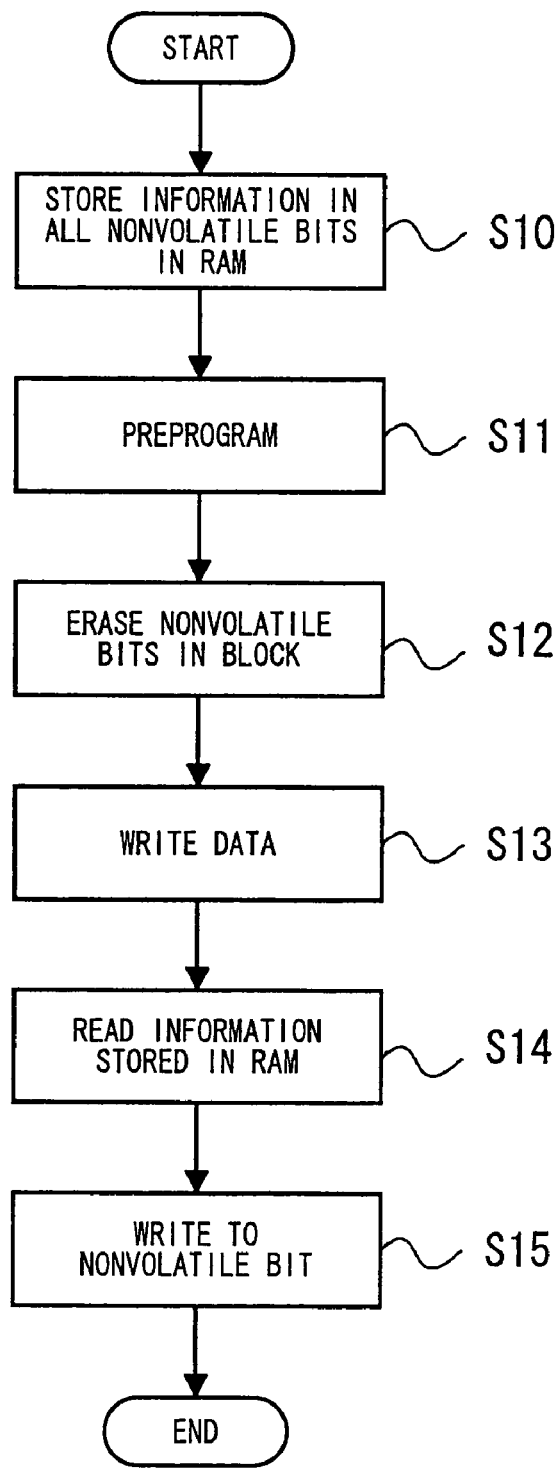
FIG. 11 is a flow chart showing the flow of a conventional process performed when data is written to a sector protected by a nonvolatile bit.
Figure 12:
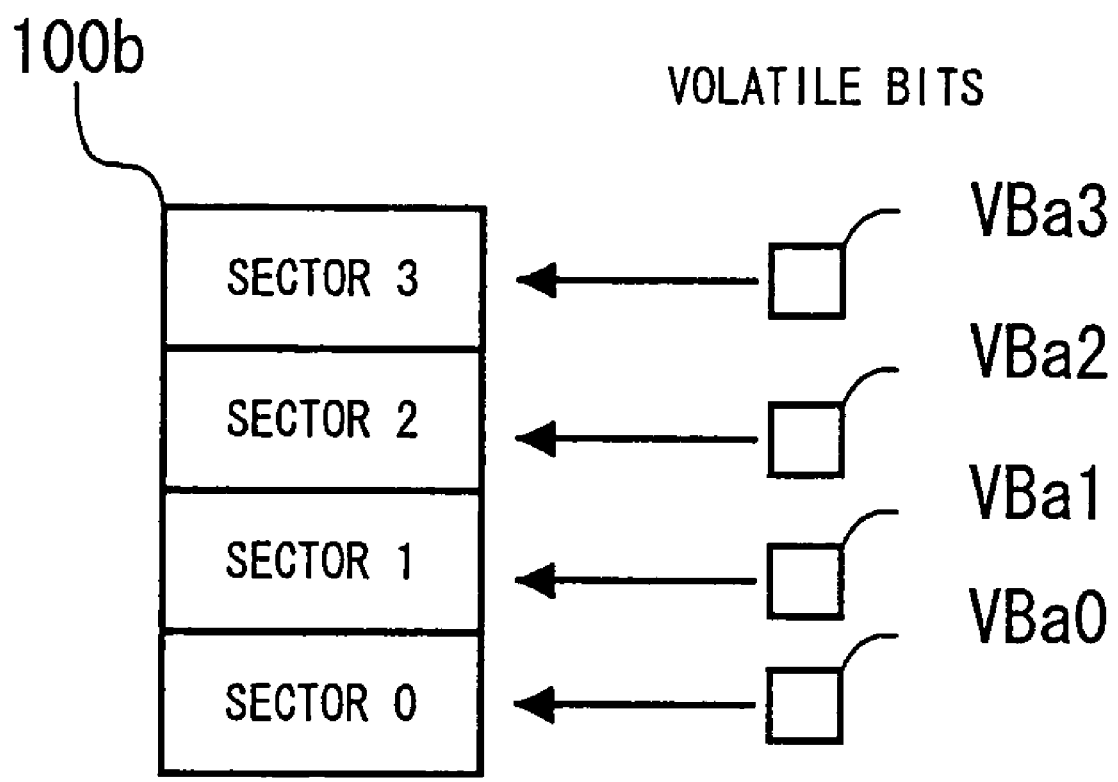
FIG. 12 is a schematic view for describing data protection by the use of a volatile bit.
Figure 13:
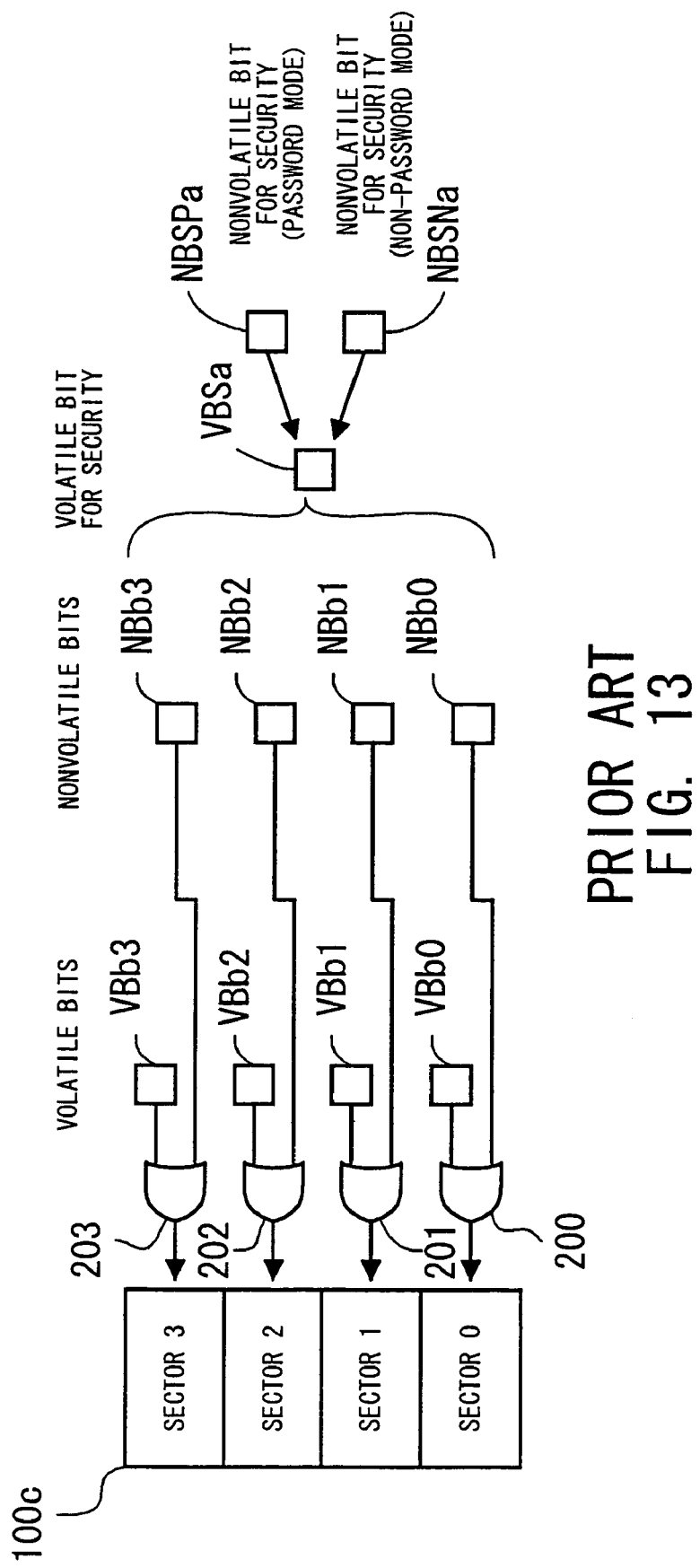
FIG. 13 is a schematic view showing an outline of a conventional semiconductor memory in which the protection state of data is changed by the use of a password.

FIG. 9 is a view showing an example of the circuit structure of the volatile bit VBS for security.

The volatile bit VBS includes an nMOS 70 which turns on at the time of a read signal being inputted to its gate to input a VBS lock signal from the nonvolatile bit NBSP via one input-output terminal, an nMOS 71 a gate of which is connected to the other input-output terminal of the nMOS 70, an inverter 72 which inverts output from the nMOS 70, and an nMOS 73 to a gate of which an inverted signal is inputted. One input-output terminal of the nMOS 71 and one input-output terminal of the nMOS 73 are connected directly and these terminals are connected to one input-output terminal of an nMOS 74 which turns on at the time of a read signal being inputted to its gate.

The other input-output terminal of the nMOS 71 is connected to the input side of a latch circuit made up of inverters 75a and 75b. The other input-output terminal of the nMOS 73 is connected to the output side of the latch circuit. One input-output terminal of an nMOS 76 to a gate of which a password cancellation signal is inputted is connected to the input side of the latch circuit. One input-output terminal of an nMOS 78 to a gate of which output from an AND circuit 77 which finds out the logical product of a VBS write signal and a lock signal is inputted is connected to the output side of the latch circuit. The other input-output terminal of the nMOS 76 and the other input-output terminal of the nMOS 78 are grounded.

Output from the volatile bit VBS is outputted from the output terminal of the inverter 75a as a lock signal.

In the initial state a read signal is at the H level, so a VBS lock signal is inputted from the nonvolatile bit NBSP. When this VBS lock signal is at the H level (non-locked state and non-password mode), an H level is latched in the volatile bit VBS and a lock signal outputted from the volatile bit VBS is also at the H level indicative of a non-locked state.

To change this non-locked state to a locked state, a command to change a VBS write signal to the H level should be inputted from the outside. By doing so, the nMOS 78 turns on and an L level is latched. Therefore, the lock signal changes to the L level indicative of a locked state.

On the other hand, when this VBS lock signal is at the L level (password mode), an L level is latched and a lock signal outputted from the volatile bit VBS is also at the L level indicative of a locked state.

To change this locked state to a non-locked state, a command to compare a password a user input and a password the user set in advance in the password store section 30 should be inputted from the outside. If they match, then a password cancellation signal will change to the H level. Accordingly, an H level is latched and the lock signal changes to the H level indicative of a non-locked state.

As stated above, the volatile bit for determining whether to lock the protection state of data is included, so two-stage security can be provided. If the protection state of data is locked, authentication with a password must be performed to unlock. This will enhance security.

As has been described in the foregoing, in the present invention the volatile bit is used for controlling the protection state of data in a nonvolatile memory and the nonvolatile bits are used for determining the initial state of the volatile bit. This enables a quick change in the protection state of data. Moreover, even when power is turned on or off, the protection state of data in each area can be held. Therefore, sufficient security can be ensured.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory having a function of protecting data stored in a nonvolatile semiconductor memory, the semiconductor memory comprising:

a volatile protection state specification section for controlling the protection state of data in the nonvolatile semiconductor memory; and a nonvolatile initial state store section for controlling the initial state of the protection state specification section, wherein the protection state specification section is located for each of sectors in the nonvolatile semiconductor memory, further wherein the initial state store section is located for each of the protection state specification sections.

2. The semiconductor memory according to claim 1, wherein the protection state specification section includes one bit and determines the protection state of data by one or zero, further wherein the initial state store section includes one bit and determines the initial state by one or zero.

3. The semiconductor memory according to claim 1, wherein the number of the initial state store section located for the plurality of the protection state specification sections is one.

4. The semiconductor memory according to claim 1, further comprising a volatile protection state lock section for locking the state of the protection state specification sections.

5. The semiconductor memory according to claim 4, wherein the protection state lock section includes one bit and determines by one or zero whether to lock the protection state of data.

6. The semiconductor memory according to claim 4, further comprising a second nonvolatile initial state store section for determining an initial state of the protection state lock section.

7. The semiconductor memory according to claim 6, wherein the second initial state store section includes one bit and determines by one or zero whether to lock the protection state of data.

8. The semiconductor memory according to claim 5, wherein a security level is divided into two stages on the basis of whether the protection state of data is locked by the protection state lock section, further wherein authentication with a password is performed to change the protection state of data from a locked state to a non-locked state.

9. A semiconductor memory having a function of protecting data stored in a nonvolatile semiconductor memory, the semiconductor memory comprising:

a volatile protection state specification section for controlling the protection state of data in the nonvolatile semiconductor memory; and a nonvolatile initial state store section for controlling the initial state of the protection state specification section, wherein the number of the initial state store section located for a plurality of the protection state specification sections is one.

10. A semiconductor memory having a function of protecting data stored in a nonvolatile semiconductor memory, the semiconductor memory comprising:

a volatile protection state specification section for controlling the protection state of data in the nonvolatile semiconductor memory;

a nonvolatile initial state store section for controlling the initial state of the protection state specification section;

a volatile protection state lock section for locking the state of the protection state specification section; and a second nonvolatile initial state store section for determining an initial state of the protection state lock section.

11. The semiconductor memory according to claim 10, wherein the second initial state store section includes one bit and determines by one or zero whether to lock the protection state of data.

* * * * *

UNITED STATES PATENT AND TRADEMARK OFFICE
CERTIFICATE OF CORRECTION

PATENT NO. : 6,970,381 B2
DATED : November 29, 2005
INVENTOR(S) : Daisuke Nakata It is certified that error appears in the above-identified patent and that said Letters Patent is hereby corrected as shown below:

Column 12,
Line 17, change "5" to -- 4 --.

Signed and Sealed this

Fourth Day of April, 2006

JON W. DUDAS
*Director of the United States Patent and Trademark Office*